(12) United States Patent
Mauer (10) Patent No.: US 6,998,909 B1
(45) Date of Patent: Feb. 14, 2006

(54) METHOD TO COMPENSATE FOR MEMORY EFFECT IN LOOKUP TABLE BASED DIGITAL PREDISTORTERS

(75) Inventor: Volker Mauer, High Wycombe (GB)

(73) Assignee: Altera Corporation, San Jose, CA (US)

( * ) Notice: Subject to any disclaimer, the term of this patent is extended or adjusted under 35 U.S.C. 154(b) by 32 days.

(21) Appl. No.: 10/781,082

(22) Filed: Feb. 17, 2004

(51) Int. Cl.
*G01R 19/00* (2006.01)
(52) U.S. Cl. .................................... 330/2; 330/149
(58) Field of Classification Search ............. 330/2, 330/149; 455/126, 63, 501; 375/296, 436
See application file for complete search history.

(56) References Cited

U.S. PATENT DOCUMENTS

| | | | | |
|---|---|---|---|---|
| 5,742,201 | A * | 4/1998 | Eisenberg et al. | 330/149 |
| 5,770,971 | A * | 6/1998 | McNicol | 330/149 |
| 5,903,611 | A * | 5/1999 | Schnabl et al. | 455/126 |
| 5,959,499 | A * | 9/1999 | Khan et al. | 330/149 |
| 6,275,685 | B1 * | 8/2001 | Wessel et al. | 330/149 |

OTHER PUBLICATIONS

Andrew S. Wright and Willem G. Durtler, *Experimental Performance of an Adaptive Digital Linearized Power Amplifier*, IEEE Transactions on Vehicular Technology, vol. 41, No. 4, Nov. 1992 (pp. 395-400).

G. Lazzarin, S. Pupolin, A. Sarti, *Nonlinearity Compensation in Digital Radio Systems*, IEEE Transactions on Communications, vol. 42, No. 2/3/4, Feb./Mar./Apr. 1994 (pp. 988-999).

H. Qian, and G.T. Zhou, *A neural Network Predistorter For Nonlinear Power Amplifiers With Memory*, Proc. 10th IEEE DSP Workshop (DSP '2002), Pine Mountain, GA, Oct. 2002).

* cited by examiner

Primary Examiner—Peguy JeanPierre
Assistant Examiner—Lam T. Mai
(74) Attorney, Agent, or Firm—Beyer Weaver & Thomas, LLP (57) ABSTRACT

Methods and apparatus are provided for nonlinear compensation of a supposedly linear behaving semiconductor device (e.g., power amplifier). A measure corresponding to the temperature of the silicon in the semiconductor device can be derived from both current and previous inputs using a filter (e.g., infinite impulse response or finite impulse response). This measure can then be used as an index, or address, of a lookup table. The lookup table is continually updated through a feedback loop where the updated lookup table values (e.g., correction factors) are based on the differences between the desired output signals and the measured output signals. A lookup table value, when combined with an input signal, will distort the input signal in an amount that is substantially an inverse of the distortion introduced by the semiconductor device. As a result, an output signal that is in substantial linear relationship with the input signal can be achieved.

46 Claims, 6 Drawing Sheets

METHOD TO COMPENSATE FOR MEMORY EFFECT IN LOOKUP TABLE BASED DIGITAL PREDISTORTERS

BACKGROUND

1. Field of the Invention

The present invention relates to the handling of distortion introduced by semiconductor devices. More specifically, the techniques of the present invention provide mechanisms for compensating for memory effect in lookup-table-based digital predistorters.

2. Description of the Prior Art

In processing a signal through a semiconductor device, it is advantageous to be able to predict with some regularity the outcome of the processed signal. Often, however, the design of the semiconductor device produces an outcome that does not conform ideally to the function of the semiconductor device. This is because in some cases the semiconductor device can introduce distortion into the processed signal.

For instance, in wireless systems, a power amplifier is often used to drive an antenna. Ideally, the power amplifier produces output signals that have a linear relationship with the input signals. However, power amplifiers typically produce output signals that deviate from this linear relationship to some degree. As such, decoding the signal at the receiver side becomes more difficult and may result in interference in other frequency bands. The amount of deviation can be viewed as the distortion introduced by the power amplifier.

In an attempt to control the distortion introduced by the power amplifier, digital predistorters may be used. Generally, a digital predistorter applies to the input signal a correction factor that is the inverse of the distortion amount. Some predistorters implement a lookup table for storing and applying the correction factor. See *Experimental Performance of an Adaptive Digital Linearized Power Amplifier*, Andrew S. Wright, Willem G. Durtler, IEEE Transactions on Vehicular Technology, Vol. 41, No. 4, November 1992, the contents of which are hereby incorporated by reference. Although the lookup-table-based predistorter provides a level of distortion compensation to the output signal, the output signal can still deviate from the linear relationship. This is because some lookup-table-based predistorters are designed on the premise that the distortion only depends on the current input. In practice, it has been found that the distortion also depends on the previous inputs. This condition is commonly referred to as the "memory effect" in power amplifiers. The memory effect can fundamentally limit the effectiveness of distortion compensation mechanisms such as lookup-table-based predistorters.

Some lookup-table-based predistorters do compensate for the memory effect. However, their methods of implementation are typically complex or expensive, for example, the use of lookup table values derived from an internal representation of measured Volterra coefficients. Some predistorters are not lookup-table-based, but do compensate for the memory effect of the amplifier. However, these predistorters also implement methods that are complex to use and less efficient as compared to lookup-table-based predistorters.

It is therefore desirable to provide improved methods and apparatus for compensating for the memory effect of semiconductor devices. More specifically, it is desirable to provide techniques and mechanisms for efficiently and effectively compensating for the memory effect in lookup-table-based digital predistorters.

SUMMARY

Methods and apparatus are provided for distortion compensation in semiconductor devices. More specifically, methods and apparatus are provided for efficiently and effectively compensating for the memory effect in lookup-table-based digital predistorters.

One aspect of the present invention involves a predistorter operable to compensate for distortion introduced by a semiconductor device. The predistorter includes an index module operable to generate index values from current and past values of an input signal intended for the semiconductor device; a lookup table operable to provide one of a plurality of correction factors in response to each of the index values; and a conditioning module operable to apply the correction factor to the input signal, wherein application of the correction factor to the input signal compensates, at least in part, for portions of the distortion corresponding to both the current and past values of the input signal.

Another aspect of the present invention involves a predistorter operable to compensate for distortion introduced by a semiconductor device. The predistorter includes a lookup table operable to provide a correction factor in response to an index value generated from a plurality of past values of an input signal intended for the semiconductor device; and a conditioning module operable to apply the correction factor to the input signal, wherein application of the correction factor to the input signal compensates, at least in part, for portions of the distortion corresponding to the plurality of past values of the input signal.

Another aspect of the present invention involves a predistorter operable to compensate for distortion introduced by a semiconductor device. The predistorter includes an input module configured for receiving a current input signal intended for the semiconductor device; a feedback module configured for receiving a feedback signal from the semiconductor device, the feedback signal being the result of the current input signal having been processed by the semiconductor device; a comparator configured for aligning the current input signal and the feedback signal in determining a differential value; a lookup table configured for correlating an index generated from the current input signal and a past input signal with a correction factor, the correction factor being a function of the differential value; and an output module configured for conditioning a future input signal with the correction factor and outputting the conditioned future input signal to the semiconductor device, the conditioned future input signal being able to compensate, at least in part, for portions of the distortion corresponding to both the current and past input signals.

In one embodiment, the comparator includes a delay module for delaying the current input signal to match with the feedback signal. The comparator may further include a logic operator for combining the current input signal and the feedback signal in determining the differential value.

In another embodiment, the index is generated from a filter. The filter may include either an FIR or an IIR. Furthermore, the correction factor may be calculated by subtracting at least a portion of the differential value from a prior correction factor. Generally, the differential value is a non-linear function of heat generated in the semiconductor device.

Another aspect of the present invention involves a method to compensate distortion introduced by a semiconductor device. The method includes (1) receiving a current input signal intended for the semiconductor device; (2) receiving a feedback signal from the semiconductor device, the feedback signal being the result of the current input signal having been processed by the semiconductor device; (3) aligning the current input signal and the feedback signal in determining a differential value; (4) calculating a correction factor, the correction factor being a function of the differential value; (5) generating an index from the current input signal and a past input signal; (6) correlating the index with the correction factor; (7) conditioning a future input signal with the correction factor; and (8) outputting the conditioned future input signal to the semiconductor device, the conditioned future input signal being able to compensate, at least in part, for portions of the distortion corresponding to both the current and past input signals.

In one embodiment, the method further includes converting the current input signal into a set of corresponding signal components. In addition, the method may include converting the feedback signal into a set of corresponding signal components.

Generally, aligning the current input signal and the feedback signal includes delaying the current input signal to match with the feedback signal. This may also include combining the current input signal and the feedback signal in determining the differential value. Furthermore, generating the index includes filtering the current input signal with a past input signal. Also, calculating the correction factor includes multiplying the differential value by a convergence factor and subtracting the result from a prior correction factor, wherein the convergence factor is a constant between 0 and 1.

Another aspect of the present invention involves a predistorter operable to compensate for distortion introduced by a semiconductor device. The predistorter includes an input module configured for receiving a current input signal intended for the semiconductor device; a feedback module configured for receiving a feedback signal from the semiconductor device, the feedback signal being the result of the current input signal having been processed by the semiconductor device; a comparator configured for aligning the current input signal and the feedback signal in determining a differential value; means for generating an index from the current input signal and a past input signal; a lookup table configured for correlating the index with a correction factor, the correction factor being a function of the differential value; and an output module configured for conditioning a future input signal with the correction factor and outputting the conditioned future input signal to the semiconductor device, the conditioned future input signal being able to compensate, at least in part, for portions of the distortion corresponding to both the current and past input signals.

Another aspect of the present invention involves an electronic system that includes the predistorter mentioned above. The electronic system may include ASIC, PLD, DSP/PLD, or ASIC/DSP. Yet, another aspect of the invention pertains to computer program products including a machine readable medium on which is stored program instructions, tables or lists, and/or data structures for programming a PLD to operate with a method as described above.

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

DETAILED DESCRIPTION INTRODUCTION

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Aspects of this invention provide a digital predistorter having functionality for controlling the distortion introduced by a semiconductor device. In one example, methods and apparatus are provided for nonlinear compensation of a supposedly linear behaving semiconductor device (e.g., power amplifier). A measure corresponding to the temperature of the silicon in the semiconductor device can be derived from both current and previous inputs using a filter (e.g., infinite impulse response—IIR or finite impulse response—FIR). This measure can then be used as an index, or address, of a lookup table. The lookup table is continually updated through a feedback loop where the updated lookup table values (e.g., correction factors) are based on the differences between the desired output signals and the measured output signals. A lookup table value (e.g., correction factor), when combined with an input signal, will distort the input signal in an amount that is substantially an inverse of the distortion introduced by the semiconductor device. As a result, an output signal that is in substantial linear relationship with the input signal can be achieved.

In general, semiconductor devices typically introduce distortion into the output signal generated by the semiconductor device. The distortion may come in any form, such as noise, resulting from the operating conditions of the semiconductor device. The operating conditions may include the temperature of the silicon in the semiconductor device. For example, the temperature of the silicon may rise to a level that substantially affects the behavioral characteristic of the semiconductor device. As a result, distortion may be introduced into the output signal such that the output signal does not substantially conform to the expected function of the semiconductor device. Often the amount of distortion is the result of current and/or previous signal inputs. For example, depending on how strong (e.g., measured by the amplitude of the signal) the input signal, a corresponding amount of heat is generated in the semiconductor device. The heat may leave a residual temperature effect in the silicon that may cause distortion to be introduced into the output signal. This residual temperature effect may even affect subsequent outputs. This condition is commonly known as the memory effect of semiconductor devices. As such, the present invention generally provides techniques and mechanisms for efficiently and effectively compensating for the memory effect in lookup-table-based digital predistorters.

Apparatus and Environment

Generally, embodiments of the present invention may employ various processes or methods involving data stored in or transferred through one or more computing devices. Embodiments of the present invention may also relate to an apparatus for performing these operations. Such apparatus may be specially constructed to implement a digital predistorter according to the techniques of the present invention.

In addition, embodiments of the present invention relate to computer readable media or computer program products that include program instructions and/or data (including data structures) for performing various computer-implemented operations. Examples of computer-readable media include, but are not limited to, magnetic media such as hard disks, floppy disks, and magnetic tape; optical media such as CD-ROM disks; magneto-optical media; semiconductor memory devices, and hardware devices that are specially configured to store and perform program instructions, such as read-only memory devices (ROM) and random access memory (RAM). The data and program instructions may also be embodied on a carrier wave or other transport medium (including electronic or optically conductive pathways).

Examples of program instructions include low-level code, such as that produced by a compiler, as well as higher-level code that may be executed by the computer using an interpreter. Further, the program instructions may be machine code, source code and/or any other code that directly or indirectly controls operation of a computing machine in accordance with this invention. The code may specify input, output, calculations, conditionals, branches, iterative loops, etc.

Figure 1:
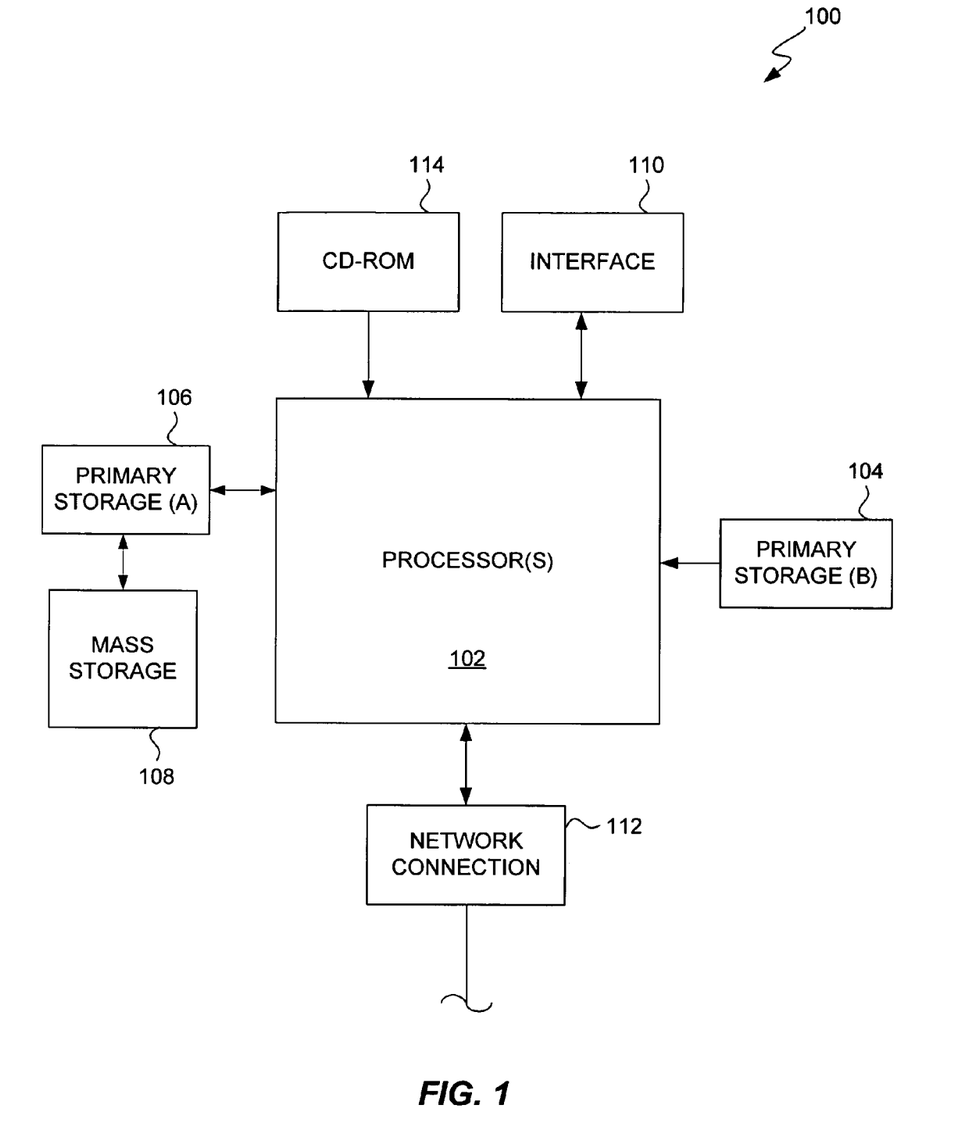
FIG. 1 illustrates a typical computer system that, when appropriately configured or designed, can serve as an apparatus for implementing this invention.

FIG. 1 illustrates, in simple block format, a typical computer system that can serve as a computational apparatus for implementing a digital predistorter in a programmable chip according to the techniques of present invention. The computer system 100 includes any number of processors 102 (also referred to as central processing units, or CPUs) that are coupled to storage devices including primary storage 106 (typically a random access memory, or RAM), primary storage 104 (typically a read only memory, or ROM). In the depicted embodiment, primary storage 104 acts to transfer data and instructions uni-directionally to the CPU and primary storage 106 is used typically to transfer data and instructions in a bi-directional manner. Both of these primary storage devices may include any suitable computer-readable media such as those described above. A mass storage device 108 is also coupled bi-directionally to primary storage 106 and provides additional data storage capacity and may include any of the computer-readable media described above. Mass storage device 108 may be used to store programs, data and the like and is typically a secondary storage medium such as a hard disk. Frequently, such programs, data and the like are temporarily copied to primary memory 106 for execution on CPU 102. It will be appreciated that the information retained within the mass storage device 108, may, in appropriate cases, be incorporated in standard fashion as part of primary storage 104. A specific mass storage device such as a CD-ROM 114 may also pass data uni-directionally to the CPU or primary storage.

CPU 102 is also coupled to an interface 110 that connects to one or more input/output devices such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 102 optionally may be coupled to an external device such as a database or a computer or telecommunications network using an external connection as shown generally at 112. With such a connection, it is contemplated that the CPU might receive information from the network, or might output information to the network in the course of performing the method steps described herein.

Figure 2:
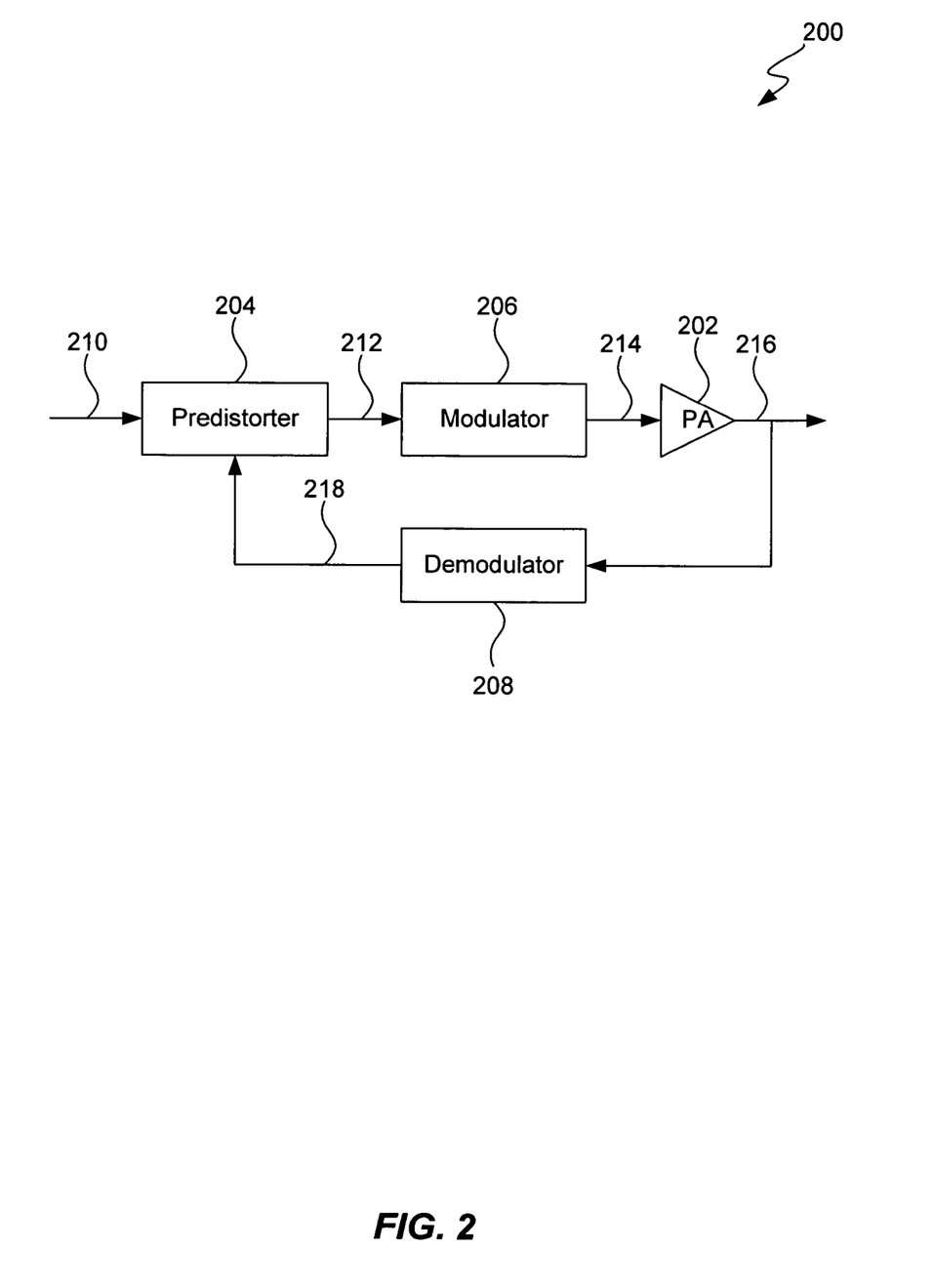
FIG. 2 illustrates a block diagram of a power amplifier coupled with a predistorter according to various embodiments of the present invention.

Exemplary Components for Compensating for the Memory Effect in Lookup Table Based Digital Predistorters Referring to FIG. 2, a block diagram 200 of a power amplifier 202 coupled with a predistorter 204 according to various embodiments of the present invention is illustrated. Predistorter 204 is typically configured for receiving an input signal 210 that is intended for processing by power amplifier 202. Predistorter 204 will often provide the necessary conditioning to input signal 210 in generating a predistorted signal 212 that may substantially compensate for any anticipated distortion introduced by power amplifier 202. For instance, predistorter 204 can condition input signal 210 such that the distortion introduced by power amplifier 202 is at least partially canceled in producing an output signal 216 that is substantially linear relative to the corresponding input signal 210. The conditioning may be based on any number of factors including but not limited to the current and/or previous input signals 210. In one embodiment, predistorter 204 is configured to receive a feedback signal (e.g., 218; 216) for conditioning input signal 210.

Predistorter 204 is also configurable to output predistorted signal 212 after input signal 210 has been conditioned. At this point, predistorted signal 212 can be input either directly into power amplifier 202 or first into an optional modulator 206 prior to feeding into power amplifier 202. In some cases, modulator 206 will be needed for adjusting predistorted signal 212 to a frequency suited for power amplifier 202 or the electronic design of which power amplifier 202 is a part. In any case, power amplifier 202 will be adapted for receiving predistorted signal 212 or a modulated version of predistorted signal 212 in signal 214.

According to the functionality of power amplifier 202, power amplifier 202 will process either predistorted signal 212 or signal 214 in generating an output signal 216 that is substantially linear with respect to input signal 210. Output signal 216 may be used for further processing in the electronic design and/or in a feedback loop as shown in FIG. 2. The feedback loop includes either feeding output signal 216 directly back into predistorter 204 or first into optional demodulator 208 prior to feeding into predistorter 204.

Demodulator 208 is typically used if output 216 needs to be adjusted to a frequency suitable for predistorter 204. In one embodiment, demodulator 208 is functionally the inverse of modulator 206.

Figure 3:
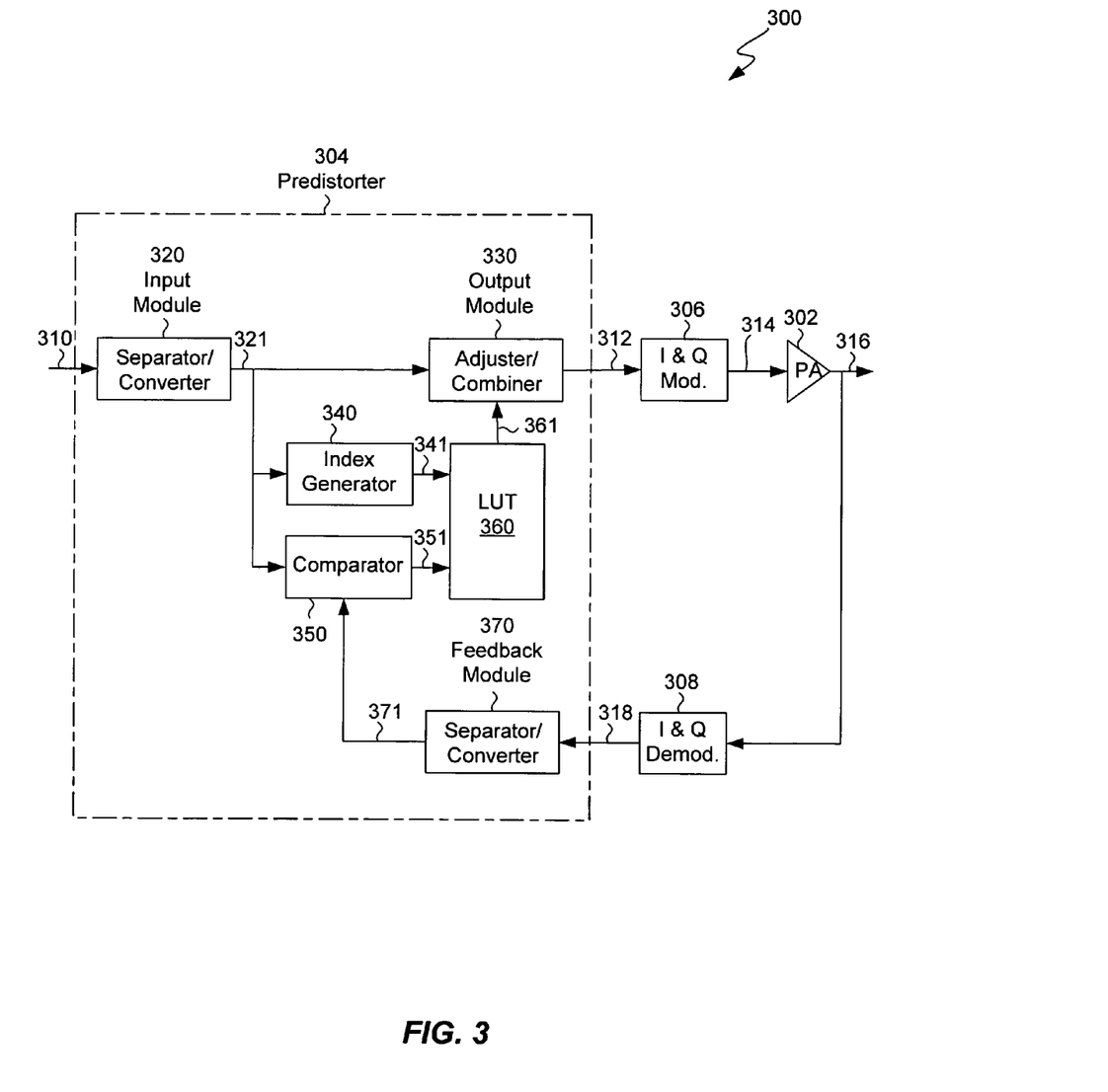
FIG. 3 illustrates a detailed block diagram of a power amplifier coupled with a predistorter according to various embodiments of the present invention.

Next, FIG. 3 illustrates a detailed block diagram 300 of a power amplifier 302 coupled with a predistorter 304 according to various embodiments of the present invention. Many components of block diagram 300 resemble those of block diagram 200. For example, input signal 310, predistorter 304, predistorted signal 312, modulator 306, signal 314 power amplifier 302, output signal 316, demodulator 308, signal 318 are respectively similar to input signal 210, predistorter 204, predistorted signal 212, modulator 206, signal 214, power amplifier 202, output signal 216, demodulator 208, and signal 218.

A purpose of predistorter 304 is to provide nonlinear compensation for distortion introduced by a semiconductor device such as power amplifier 302. In some examples, predistorter 304 includes an input module 320 operable to receive an input signal (e.g., 310), which is intended for power amplifier 302; a feedback module 370 operable to receive a feedback signal (e.g., 318, 316) from power amplifier 302; a comparator 350 operable to align input signal 310 and the feedback signal in determining a differential value 351; an index generator 340 operable to generate an index 341 from current and/or previous input signals 310; a lookup table 360 operable to generate correction factor 361, which is a function of differential value 351, and to tabulate index 341 with correction factor 361; and an output module 330 operable to condition input signal 310 with correction factor 361 and output the conditioned input signal (e.g., 312) to power amplifier 302. It is important to note that the conditioned input signal is able to substantially compensate for some or substantially all anticipated nonlinearity resulting from distortion corresponding to current and/or previous input signals and introduced by power amplifier 302.

In one embodiment, input module 320 includes a separator/converter for separating/converting input signal 310 into a set of corresponding input signal components (e.g., in-phase, quadrature, magnitude, phase, real, imaginary, etc.). Likewise, feedback module 370 includes a separator/converter for separating/converting the feedback signal into a set of corresponding feedback signal components. Input module 320 and feedback module 370 are also configured to output the corresponding signal components via signals 321 and 371 respectively. Signal 321 can be used as an input into output module 330 for conditioning, index generator 340 for generating index 341, and/or comparator 350 for determining differential value 351. Signal 371 can also be used as an input into comparator 350 for determining differential value 351. According to the implementation shown, differential value 351 represents a non-linear function relating to temperature/heat generated in the semiconductor device.

In contrast to conventional predistorters, index generator 340 takes into account current as well as previous input signals 310 in generating index 341. An advantage of this is to allow a more accurate assessment of the correction factor needed to adjust for the distortion that is introduced by the semiconductor device while processing a signal. That is, because of its dependence on past input signals, index 341 is able to address the memory effect in semiconductor devices. In one specific embodiment, a filter (e.g., infinite impulse response; finite impulse response) is employed for this purpose. Index generator 340 may receive any signal in generating a corresponding index 341 that will be used in lookup table 360 to associate a measure (e.g., weight) to certain correction factors. Index 341 may in turn be a measure in any of a variety of formats such, for example, magnitude, phase, in-phase, and quadrature signal components.

Typically, output module 330 is configured to condition signal 321 with correction factor 361. Output module 330 may employ any method to condition signal 321. For example, output module 330 may simply adjust signal 321 by correction factor 361. On the other hand, output module 330 may further combine the set of input signal components from signal 321 into a consolidated predistorted signal 312. In effect, output module 330 may perform the reverse of the separator/converter function of input module 320 upon having signal 321 first adjusted by the correction factor. It will be appreciated by those skilled in the art that feedback module 370, comparator 350, index generator 340, lookup table 360, and output module 330 are each configured to function automatically upon receiving input signal 310 by input module 320.

Figure 4:
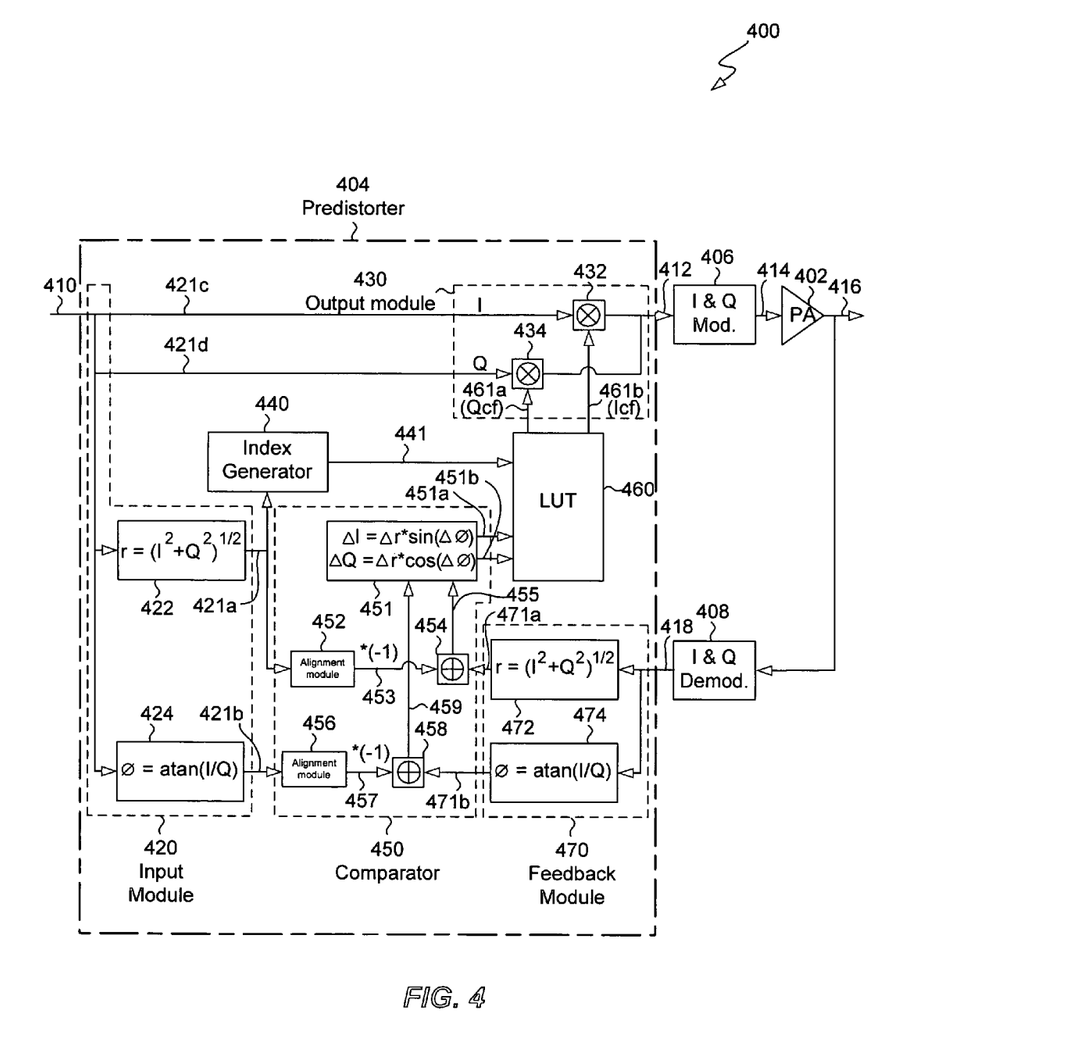
FIG. 4 illustrates a further detailed block diagram of a power amplifier coupled with a predistorter according to various embodiments of the present invention.

FIG. 4 illustrates a further detailed block diagram 400 of a power amplifier 402 coupled with a predistorter 404 according to various embodiments of the present invention. Block diagram 400 also exhibits and uses many of the same components as shown in block diagram 300. For example, input signal 410, predistorter 404, predistorted signal 412, modulator 406, signal 414, power amplifier 402, output signal 416, demodulator 408, signal 418 are respectively similar to input signal 310, predistorter 304, predistorted signal 312, modulator 306, signal 314, power amplifier 302, output signal 316, demodulator 308, and signal 318. In addition, signals 421(a–d) are similar to signal 321; index signal 441 is similar to index signal 341; differential value signals 451(a, b) are similar to differential value signal 351; signals 471(a, b) are similar to signal 371; and correction factor signals 461(a, b) are similar to correction factor signal 361.

Similar to predistorter 304, predistorter 404 receives input signal 410 at input module 420. A purpose of input module 420 is to prepare input signal 410 for comparator 450 to compare with the feedback signal (e.g., signals 471a and 471b). Input signal 410 may be provided in any signal format. Input module 420 may then separate and/or convert input signal 410 into a set of corresponding signal components. Any set of corresponding signal components may be generated that is consistent with conditioning input signal 410. For example, signal components may include in-phase, quadrature, magnitude, phase, real, or imaginary signal components.

As illustrated in FIG. 4, current input signal 410 is separated/converted by input module 420 into signal components 421c and 421d that include respectively in-phase (i.e., I) and quadrature (i.e., Q) signal components. In addition, current input signal 410 is separated into signal components 421a and 421b that include respectively magnitude (i.e., r) 422 and phase (i.e., Ø) 424. Magnitude 422 and phase 424 can be individually converted/calculated from the in-phase and quadrature signal components of input signal 410. That is, magnitude 422 is the square root of collectively in-phase squared plus quadrature squared (e.g., $r=(I^2+Q^2)^{1/2}$) and phase 424 is the arc tangent of in-phase divided by quadrature (e.g., Ø=atan(I/Q)). The signal components 421c and 421d are eventually output from input module 420 and fed into output module 430 as inputs. On the other hand, signal components 421a and 421b are outputted from input module 420 and fed into comparator 450 as inputs. It is important to note that signal component 421a is also fed into index generator 440 as an input. The significance of this will be discussed below in regards to index generator 440.

In the feedback loop, feedback module 470 can perform similar separation and conversion functions as input module 420. A purpose of feedback module 470 is to receive a feedback signal (e.g., 418, 416) and prepare the feedback signal for comparator 450 to compare with input signal 410 (e.g., via signals 421*a* and 421*b*). The feedback signal can be in any variety of signal formats (e.g., in-phase, quadrature, magnitude, phase, real, imaginary, etc.), but will usually correspond with the signal format of predistorted signal 412. Generally, the feedback signal is based on the semiconductor-device-processed input signal, for example, the amplified predistorted signal 412/signal 414 (e.g., output signal 416; signal 418). Feedback module 470 separates the feedback signal (e.g., 418, 416) into signal components 471*a* and 471*b* that include respectively magnitude (i.e., r) 472 and phase (i.e., Ø) 474, which are individually converted from the in-phase and quadrature signal components of the feedback signal.

Signals 421*a*, 421*b*, 471*a*, 471*b* are sent by input module 420 and feedback module 470 to comparator 450. Comparator 450 includes alignment modules 452 and 456, operators 454 and 458, and differentiator 451. A purpose of comparator 450 is to align input signal 410 to compare with corresponding feedback signal 418 or 416. Any suitable technique may be used to accomplish this. In a preferred embodiment, alignment modules 452 and 456 may include delay mechanisms to account for the time the feedback signal (e.g., via signals 471*a* and 471*b*) is finally received by comparator 450 so that a proper match can be done with the corresponding portion of input signal 410 (e.g., via signals 421*a* and 421*b*). Alignment modules 454 and 456 may also include signal adjustment mechanisms to account for the function of the semiconductor device. For instance, assuming that power amplifier 402 is designed to provide five-fold amplification, signals 421*a* and 421*b* will need to be amplified/multiplied five times in order to properly compare input signal 410 with the feedback signal. Additionally, alignment modules 454 and 456 may include an inverter (e.g., for multiplying signals 421*a* and 421*b* with negative one). As such, the desired (e.g., ideal, expected) output signal and the measured output signal can be effectively compared for errors resulting from any distortion introduced by the semiconductor device.

After signals 421*a* and 421*b* have been aligned, alignment modules 452 and 456 outputs signals 453 and 457 to operators 454 and 458 for comparing with signals 471*a* and 471*b*. The result of the comparison is used to determine the distortion error. As shown in FIG. 4, operators 454 and 458 are logic operators such as adders. For purposes of this illustration, the desired output signal's magnitude is effectively subtracted from the measured output signal's magnitude in determining the difference in magnitude (e.g., Δr). Likewise, the desired output signal's phase is effectively subtracted from the measured output signal's phase in determining the in-phase difference (e.g., ΔØ). Any difference in magnitude or in-phase is the error associated with the power amplifier's distortion, which is related to the temperature/heat of the silicon in the power amplifier. These differences are then output by operators 454 and 458 to differentiator 451 via signals 455 and 459.

Differentiator 451 is equipped to translate the errors into differential values 451*a* and 451*b* with a format suitable for conditioning input signal 410. For instance, since input signal 410 is separated/converted into in-phase and quadrature signal components, errors translated to in-phase and quadrature differential values are useful. In one embodiment, differential value 451*a* is the in-phase difference (e.g., ΔI=Δr*sin(ΔØ)) whereas differential value 451*b* is the quadrature difference (e.g., ΔQ=Δr*cos(ΔØ)). Generally, differential values are what the look up table has to correct for and, as will be discussed, are used to calculate correction factors.

As mentioned earlier, signal component 421*a* is also fed into index generator 440 as an input. The significance of this is to provide some form of weighting measure (e.g., index 441) that is a function of the temperature in the silicon of the semiconductor device (e.g., power amplifier 402). Since an increase in a signal's magnitude usually correlates with an increase in the temperature in the silicon, signal component 421*a* is shown feeding into index generator 440 to provide the weighting measure. It will be appreciated by those skilled in the art that other signal components (e.g., in-phase, quadrature, etc.) may be use to achieve the desired weighting measure. In order to compensate for the memory effect of the semiconductor device, index generator 440 implements a filter. Preferably, the filter takes into account current and previous inputs. Generally, the filter calculates the weighting sum of the previous inputs and gives stronger weight to the most recent inputs in generating an index. In various embodiments, the filter may be an FIR or an IIR. Furthermore, the coefficients of the filter may depend on the chosen power amplifier in use. Alternatively, the coefficients may be adaptive or fixed if the temperature behavior of the power amplifier is known.

Lookup table (LUT) 460 is configured to operate with index generator 440 and comparator 450 in providing correction factors to output module 430 so that proper conditioning of input signal 410 can be realized. A purpose of lookup table 460 is to store correction factors, which are derived from the differential values (e.g., 451*a*, 451*b*). Any algorithm may be used to determine/calculate/update the correction factors. Furthermore, correction factors can be in any format applicable for conditioning input signal 410 to efficiently and effectively compensate for the distortion introduced by power amplifier 402. For example, correction factors are substantially the inverses of the differential values/measured distortion errors. In one embodiment, correction factors also compensate for the memory effect in power amplifier 402. This can be achieved by indexing the correction factors to a corresponding index 441 from index generator 440. Lookup table 460 may already have a set of predefined correction factors and indexes. However, lookup table 460 may also be configured to continually update itself for new correction factors and indexes via the feedback loop.

Output module 430 is generally configured to receive the input signal 410 (e.g., via signal 421*c* and 421*d*) and retrieve from lookup table 460 the proper correction factors for conditioning input signal 410. The retrieval of correction factors can be based on any number of techniques. In one embodiment, output module retrieves correction factors based on the signal components of input signal 410. For example, depending on the signal components of input signal 410, output module 430 can request and/or search lookup table 460 for a correction factor with an index 461 that substantially matches/correlates with the signal components of input signal 410. A tolerance (e.g., =<5%) may be provided to determine the degree of substantial matching/correlating. Once correction factors 461*b* and 461*a* are retrieved, output module 430 can condition signals 421*c* and 421*d* with correction factors 461*b* and 461*a* by implementing operators 432 and 434 respectively.

Preferably, operators 432 and 434 are logic operators such as multipliers that adjust signal components 421c and 421d with the corresponding correction factors 461b and 461a. For instance, the present invention may use a multiplier to perform a complex multiplication with complex numbers. As illustrated, the in-phase signal component 421c (i.e., I) is multiplied by the corresponding correction factor 461b (i.e., Icf) whereas the quadrature signal component 421d (i.e., Q) is multiplied by the corresponding correction factor 461a (i.e., Qcf). The resulting conditioned signal components may later be combined to get predistorted signal 412. It will be appreciated by those skilled in the art that other combinations may be used to properly condition input signal 410 to compensate for the distortion introduced by power amplifier 402.

Figure 5:
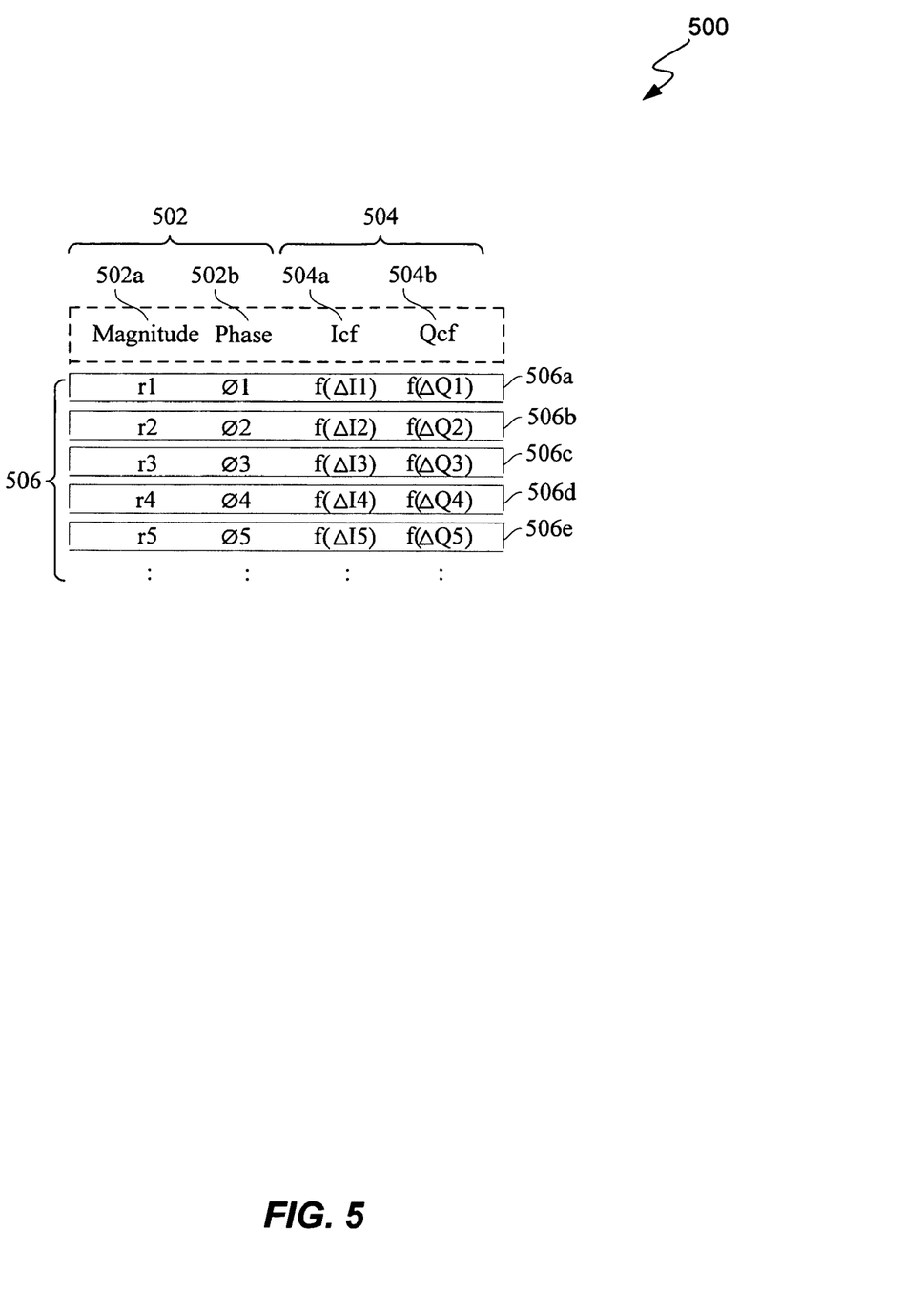
FIG. 5 illustrates a lookup table that may be utilized in a predistorter according to various embodiments of the present invention.

Next, FIG. 5 illustrates a lookup table 500 that may be utilized in a predistorter (e.g., 204, 304, 404) according to various embodiments of the present invention. Lookup table 500 may have any number of fields for easy storage and retrieval of correction factors 504. Lookup table 500 can be configured to determine the correction factor for storage and retrieval. For instance, if no knowledge of the particular power amplifier exists, lookup table 500 may initially set the correction factors 504 to a value of 1. That is, the signal will be conditioned where its predistorted signal (e.g., 412) is substantially the same as its original input signal (e.g., 410). However, if more knowledge exists, for example, from characterization of the power amplifier or from measurements on other power amplifiers of the same type, then these values can be used for initially setting the correction factors 504 in lookup table 500.

Since distortion usually changes over time (e.g., due to outside temperature changes, aging of the silicon, etc.), entries 506 of lookup table 500 can be simultaneously reviewed and recalculated using the feedback loop of the present invention. In one embodiment, an iterative process is used indefinitely. At any given iteration, if the measured value (e.g., 471a, 471b) is different from the desired value (e.g., 453, 457) for a given index, the difference is taken (e.g., subtraction of desired value from the measured value; 455; 459; 451a; 451b). Then a fraction of this difference is subtracted from the current value in the lookup table. Over time, this difference will ideally converge to zero. Mathematically, correction factors 504 can be calculated/updated by using the following equation: New correction factor=Old correction factor−convergence factor*(measured value−desired value). The convergence factor is generally a constant chosen between the values of 0 and 1. The convergence factor may also be chosen based upon any design criteria. For instance, a convergence factor closer to a value of 1 may be used if fast convergence is a priority. On the other hand, a convergence factor closer to a value of 0 may be used if stability is an overriding factor.

As mentioned, lookup table 500 may be continually updated. The lookup table update values (e.g., correction factors) are based on the difference between the desired output signal and the measured output signal (e.g., signals 451a and 451b). After the algorithm which generates these values converges, the lookup values, when combined with the input, will distort the input signal to oppose the distortion introduced by the power amplifier. As a result, the predistortion correction and the power amplifier's nonlinearity will effectively cancel out each other in producing an output that is substantially linear with the input.

As shown in FIG. 5, correction factor 504 includes in-phase correction factors 504a (Icf) and quadrature correction factors 504b (Qcf). In one embodiment, each entry (e.g., 506a–e) in lookup table 500 has correction factors 504 with corresponding indexes 502. Indexes 502 are generally generated from the index generator (e.g., 340, 440) of the present invention. Indexes 502 may include various signal components that are functions of the silicon temperature in the semiconductor devices. Indexes 502 may also be based on the memory effect in semiconductor devices. As illustrated, indexes 502 include signal components such as magnitude 502a and phase 502b. In addition, indexes 502 may be a function of other factors and/or be provided separate from the index generator. These other factors may include the current sample on its own, inputs from other sensors such as outside temperature or supply voltage, phase differences or any other factor, which is considered to influence the non-linearity that needs to be corrected. As such, a multi-dimensional lookup table 500 can be implemented.

It will be appreciated by those skilled in the art that other configurations of the predistorter (e.g., 204, 304, 404) can be formed. For example, adjustment modules similar to adjustment modules 452 and 456 may instead be implemented in either input module 420 or feedback module 470 provided that proper alignment of input signal 410 and the feedback signal can be achieved.

Figure 6:
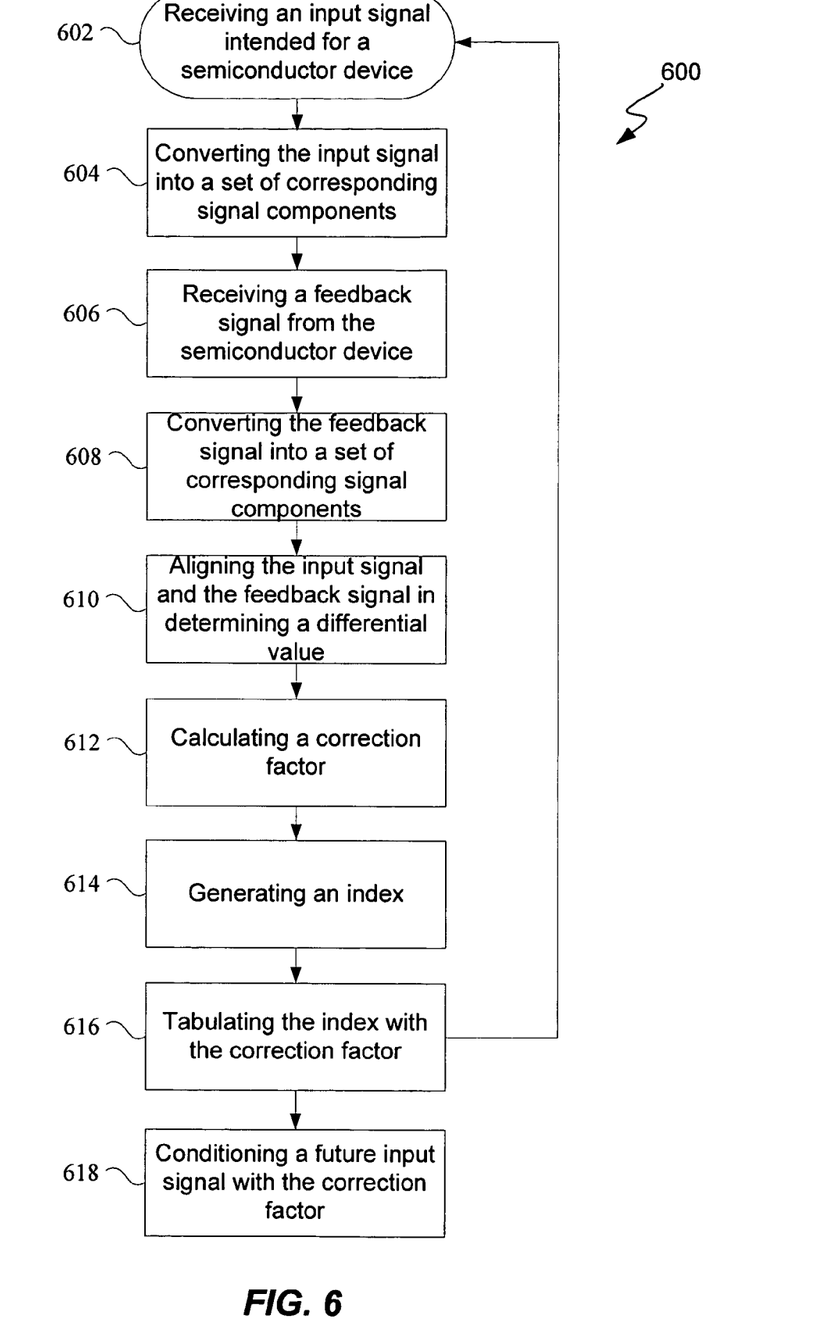
FIG. 6 illustrates a process flow diagram of a predistorter according to various embodiments of the present invention.

Methodology for Compensating for Memory Effect in Lookup Table Based Digital Predistorters FIG. 6 is a process flow diagram depicting a specific example of techniques for memory effect compensation in lookup-table-based digital predistorters. Although the specific example depicted is illustrative, it should not be construed as limiting the techniques of the present invention to any particular process flow. The techniques of the present invention provide mechanisms for allowing conditioning of input signals to compensate for anticipated distortion by semiconductor devices. In one example, the input signal is conditioned by a predistorter implementing a lookup table with correction factors that can compensate for distortion introduced by the semiconductor device. Furthermore, the correction factors can be tabulated with an index that accounts for the memory effect in semiconductor devices. The index is generated with current and/or previous signal inputs into the semiconductor device. According to a specific embodiment, the index is a weighted sum of current and/or previous signal inputs. The index can then be used to look up proper correction factors for conditioning the input signal. To facilitate the generation of the index, a filter can be implemented. In one embodiment, the filter is a FIR filter. In another embodiment, the filter is an IIR filter.

A benefit of the predistorters of the present invention is the improved compensation of distortion introduced by semiconductor devices. In comparison to the conventional lookup table predistorters, the predistorters of the present invention allow compensation for memory effects, thereby, increasing the linearity of the output signal above the fundamental limit reached with conventional lookup-table-based predistorters. This is because the predistorter of the present invention implements a filter that is based on current and/or previous signal inputs that affect the temperature in the silicon of the semiconductor device and which in turn affect the amount of distortion introduced by the semiconductor device. As such, the filter is able to generate an index that accounts for the memory effect of the semiconductor device. The index can more or less function as an equivalent to the temperature in the silicon. By correlating the index with the corresponding correction factor in a lookup table, the input signal can be conditioned for anticipated distortion with improved efficiency and effectiveness. In comparison to other implementations (e.g., Volterra based predistorters), the predistorter of the present invention is also simple to implement in digital logic; thus, allowing a cost competitive solution without degrading performance.

Referring to FIG. 6, process flow diagram 600 begins by receiving a current input signal intended for a semiconductor device in operation 602. At this point, the current input signal may be ready for converting into a set of corresponding signal components in operation 604. The signal components may include in-phase, quadrature, magnitude, or phase. Next, the operation of receiving a feedback signal from the semiconductor device is performed in operation 606. The feedback signal is typically the result of the current input signal having been processed by the semiconductor device. Similar to the current input signal, the feedback signal may be ready for converting into a set of corresponding signal components in operation 608. Again, the signal components may include in-phase, quadrature, magnitude, or phase.

Afterwards, aligning the current input signal and the feedback signal in determining a differential value is performed in operation 610. Aligning the current input signal and the feedback signal may include delaying the current input signal to match with the feedback signal that correspondingly results from the current input signal. Furthermore, aligning the current input signal and the feedback signal may include combining the current input signal and the corresponding feedback signal in determining the differential value. The differential value is generally a non-linear function of heat generated in the semiconductor device. According to various embodiments, the differential value is calculated for applying to in-phase and quadrature signal components.

Once the current input signal and the feedback signal are aligned, calculating a correction factor may be performed in operation 612. Generally, the correction factor is a function of the differential value. In one embodiment, calculating the correction factor includes subtracting at least a portion of the differential value from a prior correction factor. Next, generating an index from the current input signal and a past input signal may also be performed in operation 614. In general, this may involve using only current and past values of an input signal or current and past values of different input signals. Generating the index may include filtering the current input signal with an FIR or IIR filter. The index may be derived from any of the magnitude, phase, in-phase, and quadrature signal components.

After the correction factor is calculated and the index is generated, operation 616 may be performed for correlating the index with the correction factor. Next, the process may return back to operation 602 in order to continually update (either by replacing or by entering new values) the corresponding values in the lookup table. On the other hand, operation 618 may also be performed for conditioning a future input signal with the correction factor. A future input signal will generally correlate with the current input signal and will be identified by the output module (e.g., 430) for finding the correct correction factor to be applied. At this point, the conditioned future input signal will be ready to be outputted to the semiconductor device where the conditioned future input signal is able to compensate for distortion introduced by the semiconductor device. In addition, the conditioned future input signal can also compensate for the memory effect.

It will be appreciated that any of the operations following the receiving of the input signal in operation 602 can be performed automatically. Furthermore, it will be appreciated by persons skilled in the art that some of the operations in flow diagram 600 may be reconfigured. For example, operation 614 may come before operation 612 or done concurrently with operation 612 or that any portion of the process may be performed iteratively.

Application

While the methods, apparatus, and computer program products of this invention are applicable to any electronic design or target hardware device, they find particular value in the context of programmable logic devices (PLDs). A PLD is a programmable integrated circuit that allows the user of the circuit, using software control, to customize the logic functions the circuit will perform. Examples of PLDs are FPGAs (Field Programmable Gate Arrays) and EPLDs (Erasable Programmable Logic Devices). The logic functions previously performed by small, medium and large-scale integration integrated circuits can instead be performed by programmable logic devices. As indicated, programmable logic devices supplied by integrated circuit manufacturers like Altera Corporation (a more detailed description of these products can be found at "www.altera.com") are not inherently capable of performing any specific function. The user, in conjunction with software supplied by the PLD manufacturer, can program the PLD to perform the specific function or functions required by the user's application. The PLD then can function in a larger system designed by the user, just as though dedicated logic chips were employed.

A typical PLD includes an array of logic cells that can be individually programmed and arbitrarily interconnected to each other to provide internal input and output signals, thus permitting the performance of complex combinational and sequential logic functions. The program is implemented in the PLD by setting the states of programmable elements such as memory cells. These memory cells may be implemented with volatile memories, such as SRAMs, which lose their programmed states upon termination of power to the system. If the programmable elements used are volatile memories, the memory cells must be configured upon each system power-up in order to configure the PLD.

In general, the digital predistorter of the present invention can be implemented in an ASIC or a PLD. However, it may be implemented in a DSP/PLD or ASIC/DSP combinations, where the DSP typically performs the feedback path and the PLD performs the multiplications in the forward path. Furthermore, the digital predistorter may be implemented in any electronic system, including wireless systems.

The foregoing describes the instant invention and its presently preferred embodiments. Numerous modifications and variations in the practice of this invention are expected to occur to those skilled in the art. For instance, the present invention may be used on any device that introduces distortion into the output signal and possesses some behavioral aspect that is linked to the distortion for compensation. Although many of the components and processes are described above in the singular for convenience, it will be appreciated by one of skill in the art that multiple components and repeated processes can also be used to practice the techniques of the present invention. Therefore, the described embodiments should be taken as illustrative and not restrictive, and the invention should not be limited to the details given herein but should be defined by the following claims and their full scope of equivalents.

What is claimed is:

1. A predistorter operable to compensate for distortion introduced by a semiconductor device, comprising:
   an index module operable to generate index values from a combination of current and past values of an input signal intended for the semiconductor device;
   a lookup table operable to provide one of a plurality of correction factors in response to each of the index values; and a conditioning module operable to apply the correction factor to a future value of the input signal, wherein application of the correction factor to the future value of the input signal compensates, at least it part, for portions of the distortion corresponding to both the current and past values of the input signal.

2. The predistorter in claim 1, wherein the index module is operable to calculate a weighting sum of the current and past values of the input signal and to give more weight to recent values of the input signal in generating the index values.

3. The predistorter in claim 2, wherein the index module comprises an FIR filter.

4. The predistorter in claim 2, wherein the index module comprises an IIR filter.

5. A predistorter operable to compensate for distortion introduced by a semiconductor device, comprising:
  a lookup table operable to provide a correction factor in response to an index value generated from a plurality of past values of an input signal intended for the semiconductor device; and
  a conditioning module operable to apply the correction factor to a current value of the input signal, wherein application of the correction factor to the current value of the input signal compensates, at least in part, for portions of the distortion corresponding to the plurality of past values of the input signal.

6. The predistorter in claim 5, further comprising:
  an index module operable to generate the index value.

7. A predistorter operable to compensate for distortion introduced by a semiconductor device, comprising:
  an input module configured for receiving a current input signal intended for the semiconductor device;
  a feedback module configured for receiving a feedback signal from the semiconductor device, the feedback signal being the result of the current input signal having been processed by the semiconductor device;
  a comparator configured for aligning the current input signal and the feedback signal in deter a differential value;
  a lookup table configured for correlating an index generated from the current input signal and a past input signal with a correction factor, the correction factor being a function of the differential value; and
  an output module configured for conditioning a future input signal with the correction factor and outputting the conditioned future input signal to the semiconductor device, the conditioned future input signal being able to compensate, at least in part, for portions of the distortion corresponding to both the current and past input signals.

8. The predistorter of claim 7, wherein the input module comprises a converter for converting the current input signal into a set of corresponding signal components.

9. The predistorter of claim 8, wherein the signal components are in-phase and quadrature.

10. The predistorter of clam 8, wherein the signal components are magnitude and phase.

11. The predistorter of claim 7, wherein the feedback module comprises a converter for converting the feedback signal into a set of corresponding signal components.

12. The predistorter of claim 11, wherein the signal components are in-phase and quadrature.

13. The predistorter of claim 11, wherein the signal components are magnitude and phase.

14. The predistorter of claim 7, wherein the semiconductor device is a power amplifier.

15. The predistorter of claim 7, wherein the comparator comprises:
  a delay module for delaying the current input signal to match with the feedback signal.

16. The predistorter of claim 15, wherein the comparator further comprises:
  a logic operator for combining the current input signal and the feedback signal in deter the differential value.

17. The predistorter of claim 16, wherein the logic operator is an adder.

18. The predistorter of claim 16, wherein the differential value is calculated for in-phase and quadrature signal components.

19. The predistorter of claim 7, wherein the index is generated from a filter.

20. The predistorter of claim 19, wherein the filter is selected from the group consisting of FIR and IIR.

21. The predistorter of claim 7, wherein the index is selected from the group consisting of magnitude, phase, in-phase, and quadrature.

22. The predistorter of claim 7, wherein the correction factor is calculated by subtracting at least a portion of the differential value from a prior correction factor.

23. The predistorter of claim 7, wherein the differential value is a non-linear function of heat generated in the semiconductor device.

24. The predistorter of claim 7, wherein the feedback module, comparator, lookup table, and output module are each configured to function automatically upon receiving the current input signal by the input module.

25. The predistorter of claim 7, wherein the output module comprises a logic operator for adjust the future input signal with the correction factor.

26. The predistorter of claim 25, wherein the logic operator is a multiplier.

27. A method to compensate distortion introduced by a semiconductor device:
  receiving a current input signal intended for the semiconductor device;
  receiving a feedback signal from the semiconductor device, the feedback signal being the result of the current input signal having been processed by the semiconductor device;
  aligning the current input signal and the feedback signal in determining a differential value;
  calculating a correction factor, the correction factor being a function of the differential value;
  generating an index from the current input signal and a past input signal;
  correlating the index with the correction factor;
  conditioning a future input signal with the correction factor; and
  outputting the conditioned future input signal to the semiconductor device, the conditioned future input signal being able to compensate, at least in part, for portions of the distortion corresponding to both the current and past input signals.

28. The method of claim 27, further comprising:
  converting the current input signal into a set of corresponding signal components.

29. The method of claim 28, wherein the signal components are in-phase and quadrate.

30. The method of claim 28, wherein the signal components are magnitude and phase.

31. The method of claim 27, further comprising:
  converting the feedback signal into a set of corresponding signal components.

32. The method of claim 31, wherein the signal components are in-phase and quadrature.

33. The method of claim 31, wherein the signal components are magnitude and phase.

34. The method of claim 27, wherein the semiconductor device is a power amplifier.

35. The method of claim 27, wherein aligning the current input signal and the feedback signal comprises:
delaying the current input signal to match with the feedback signal.

36. The method of claim 35, wherein aligning the current input signal and the feedback signal further comprises:
combining the current input signal and the feedback signal in determining the differential value.

37. The method of claim 36, wherein the differential value is calculated for applying to in-phase and quadrature signal components.

38. The method of claim 27, wherein generating the index comprises:
filtering the current input signal with a past input signal.

39. The method of claim 27, wherein the index is selected from the group consisting of magnitude, phase, in phase, and quadrature.

40. The method of claim 27, wherein calculating the correction factor comprises:
multiplying the differential value by a convergence factor and subtracting this result from a prior correction factor, wherein the convergence factor is a constant between 0 and 1.

41. The method of claim 27, wherein the differential value is a non-linear function of heat generated in the semiconductor device.

42. The method of claim 27, wherein the steps following the receiving of the input signal can be performed automatically.

43. A predistorter operable to compensate for distortion introduced by a semiconductor device, comprising:
an input module configured for receiving a current input signal intended for the semiconductor device;
a feedback module configured for receiving a feedback signal from the semiconductor device, the feedback signal being the result of the current input signal having been processed by the semiconductor device;
a comparator configured for aligning the current input signal and the feedback signal in determining a differential value;
means for generating an index from the current input signal and a past input signal;
a lookup table configured for correlating the index with a correction factor, the correction factor being a function of the differential value; and
an output module configured for conditioning a future input signal with the correction factor and outputting the conditioned future input signal to the semiconductor device, the conditioned future input signal being able to compensate, at least in part, for portions of the distortion corresponding to both the current and past input signals.

44. A computer program product for programming a PLD to compensate for distortion introduced by a semiconductor device, the computer program product comprising:
at least one computer readable medium; and
computer program instructions stored within the at least one computer readable product configure for:
receiving a current input signal intended for the semiconductor device;
receiving a feedback signal from the semiconductor device, the feedback signal being the result of the current input signal having been processed by the semiconductor device;
aligning the current input signal and the feedback signal in determining a differential value;
calculating a correction factor, the correction factor being a function of the differential value;
generating an index from the current input signal and a past input signal;
correlating the index with the correction factor;
conditioning a future input signal with the correction factor; and
outputting the conditioned future input signal to the semiconductor device, the conditioned fixture input signal being able to compensate, at least in part, for portions of the distortion corresponding to both the current and past input signals.

45. An electronic system, comprising:
a predistorter operable to compensate for distortion introduced by a semiconductor device comprising:
an index module operable to generate index values from a combination of current and past values of an input signal intended for the semiconductor device;
a lockup table operable to provide one of a plurality of correction factors in response to each of the index values;
a conditioning module operable to apply the correction factor to a future value of the input signal, wherein application of the correction factor to the future value of the input signal compensates, at least in part, for portions of the distortion corresponding to both the current and past values of the input signal.

46. The electronic system of claim 45, wherein the electronic system is selected from the group consisting of ASIC, PLD, DSP/PLD, and ASIC/DSP.

* * * * *